United States Patent [19]

Pocholle et al.

[11] Patent Number: 5,247,168

[45] Date of Patent: Sep. 21, 1993

[54] LIGHT FREQUENCY CONVERTER HAVING LASER DEVICE CONNECTED IN SERIES WITH PHOTODETECTOR

[75] Inventors: Jean-Paul Pocholle, Arpajon/la Norville; Michel Papuchon, Villebon, both of France

[73] Assignee: Thomson-CSF, Puteaux, France

[21] Appl. No.: 764,232

[22] Filed: Sep. 23, 1991

[30] Foreign Application Priority Data

Sep. 21, 1990 [FR] France ............................. 90 11678

[51] Int. Cl.$^5$ ............................................. H01J 31/50
[52] U.S. Cl. ................................... 250/214 LS; 257/14
[58] Field of Search ............ 250/211 J, 208.1, 211 R, 250/214 LS, 214 LA; 357/16, 17, 19, 58, 30; 372/12, 45, 46; 377/102; 257/13, 14, 21, 257

[56] References Cited

U.S. PATENT DOCUMENTS

| | | | |
|---|---|---|---|
| 4,742,378 | 5/1988 | Ito et al. | 257/13 |
| 4,751,378 | 6/1988 | Hinton et al. | 250/213 A |
| 4,782,223 | 11/1988 | Suzuki | 250/213 A |
| 4,873,555 | 10/1989 | Coon et al. | 257/14 |
| 4,884,119 | 11/1989 | Miller | 257/14 |
| 4,904,859 | 2/1990 | Goossen et al. | 250/213 A |
| 4,941,025 | 7/1990 | Tabatabaie | 257/14 |
| 4,952,791 | 8/1990 | Hinton et al. | 250/213 A |
| 4,952,792 | 8/1990 | Caridi | 250/213 A |
| 5,111,034 | 5/1992 | Takagi | 250/213 A |
| 5,146,078 | 8/1992 | Luryi | 250/213 A |

FOREIGN PATENT DOCUMENTS 0164604 12/1985 European Pat. Off. .
0323073 7/1989 European Pat. Off. .
3732626 4/1989 Fed. Rep. of Germany .
61-150285 7/1986 Japan .

*Primary Examiner*—David C. Nelms
*Assistant Examiner*—S. Allen
*Attorney, Agent, or Firm*—Oblon, Spivak, McClelland, Maier & Neustadt

[57] ABSTRACT

A structure providing a monolithic integration of an optical detector with an optical transmitter working in the region of the visible or the near IR spectrum. This source type makes it possible to transpose a perceived image belonging to a wavelength region to another wavelength region with a good output (photons/electrons coupling). Such a device may find particular application in imagery and signal processing systems.

9 Claims, 2 Drawing Sheets

5,247,168

LIGHT FREQUENCY CONVERTER HAVING LASER DEVICE CONNECTED IN SERIES WITH PHOTODETECTOR

BACKGROUND OF THE INVENTION

Field of the Invention

The present invention is directed to a light frequency converter and more particularly to an optical-electric-optical converter transposing a detected wave to a wave located in another spectral region.

Discussion of the Background

With the development of compounds with a quantum well base, by which it is possible to control the existence of absorption bands, a new class of detector emerges. It is based on a mastery of quantum engineering in the class III-V semiconducting materials.

Concurrently, new materials emerge in the visible spectral region. The compounds used can be deposited on substrates identical with those used to achieve the function of absorption and detection at various wavelengths. This compatibility thus produces natural detection/emission coupling.

SUMMARY OF THE INVENTION

Accordingly, one object of the present invention is to provide a novel light frequency converter.

The light frequency converter according to the present invention then comprises:

a photodetector with quantum multiwells comprising a group of layers constituting the quantum multiwells comprising a first and a second face, a light radiation to be converted being received on the first face and detected by the photodetector;

a laser device placed on the second face of the quantum multiwell photodetector to be connected electrically in series with the photodetector.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
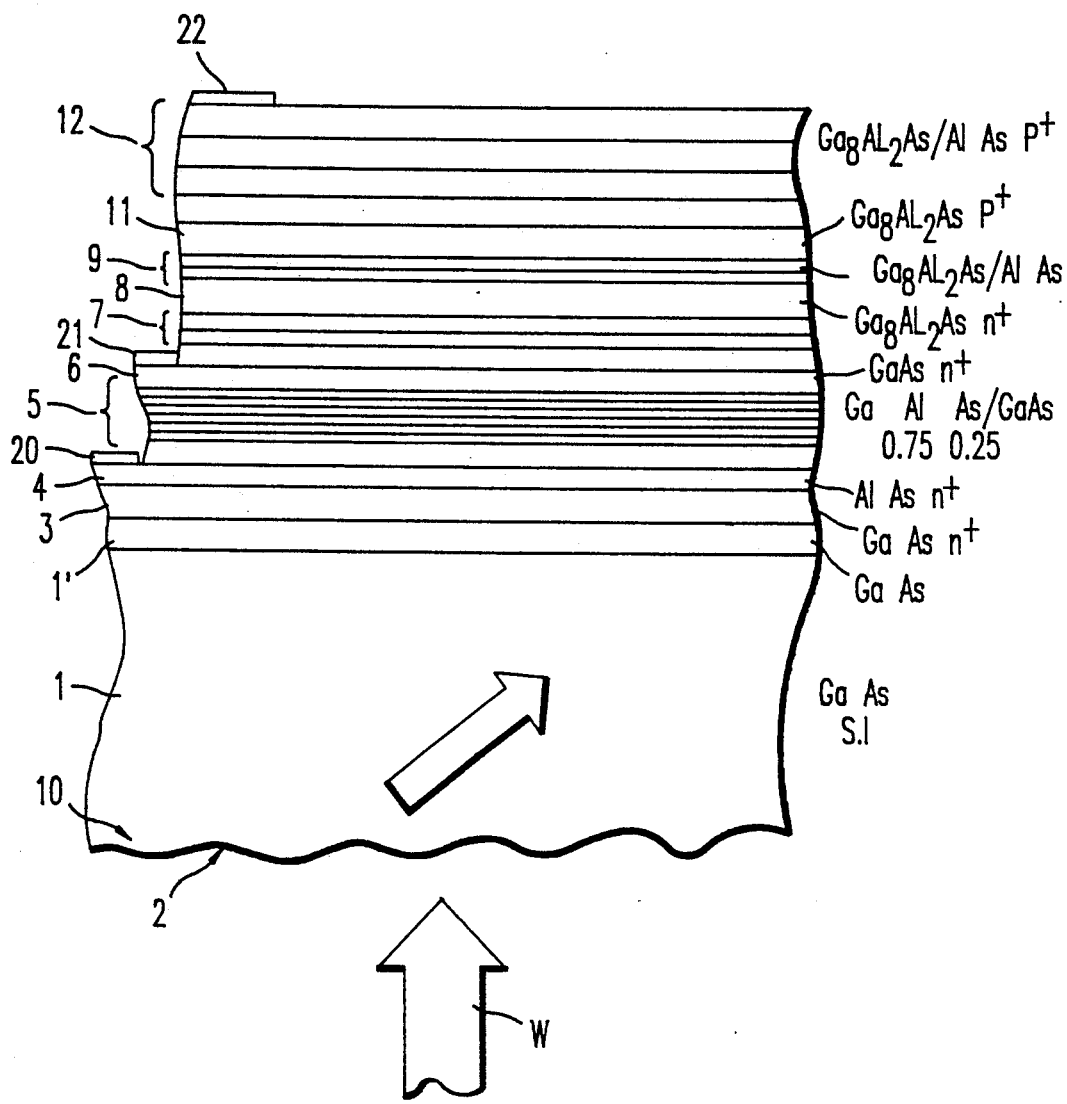
FIG. 1 details an embodiment of the light frequency converter of the present invention.

Referring now to the drawings, wherein like reference numerals designate identical or corresponding parts throughout the several views, and more particularly to FIG. 1 thereof, which shows an embodiment of a light frequency converter according to the present invention.

As shown in FIG. 1, substrate 1 of semi-insulating GaAs material comprises a face 10. A network 2 is provided which makes it possible to optimize the coupling of the incident radiation wave with the dipole of the intraband transition between energy levels in the conduction band. This network is made from standard operations of mechanical-chemical polishing, resin coating, masking and selective etching or ion beam etching. This network was produced when the growth and the technological operations were achieved.

On face 20 of the substrate opposite to face 10 and oriented according to crystallographic orientation (100) of the substrate 1, a layer 1' of GaAs of 50 nm is deposited, then another layer 3 of n+ doped GaAs (0.5 micron) is deposited on layer 1'. A layer 4 of AlAs (n+), which makes it possible with the preceding layer to make and to take a common electrical contact, is deposited on this layer 3.

Then, a group of quantum multiwells 5 is deposited. The thickness of the well materials as well as the composition of the barrier materials are selected to obtain a resonant structure in the spectral region to be detected. It is possible to use a quantum multiwell or supernetwork group. A part of the materials constituting the wells is doped to occupy the first level able to be occupied by the electrons in the conduction band. Further, each elementary quantum well of group 5 can be designed to exhibit an intraband absorption at a given wavelength.

For example:

the elementary structure or period of the quantum multiwell can be defined so that it exhibits an intraband absorption in the vicinity of 10.6 microns, for example. In this case, the composition and the thicknesses of the layers can be as follows:

width of the well: 3 nm width of the barrier: 14 nm composition of the well: GaAs composition of the barrier: $Ga_{.75}Al_{.25}As$ delta type doping of the well by silicon.

The number of multiwells determines the absorption of the system at the wavelength to be detected.

A layer 6 of n+ doped GaAs is then deposited on this structure 5. It has as its function to make possible the application of a resonant structure field 5 in the wavelength region to be detected. The thickness of this layer 6 is, for example, 1 micron.

A Bragg mirror 7 is then produced on layer 6. This mirror consists of an alternation of layers of different compositions providing different indices of refraction. The compositions are selected so that the maximum reflectivity is centered on the emission wavelength of the laser active material. Moreover, the materials are selected so that they exhibit a low absorption at the laser emission wavelength.

Bragg mirror 7 consists, for example, of about 20 $Ga_{1-x}Al_xAs$ layers alternated with about 20 AlAs layers. The value of x is, for example, 0.8.

A group of layers 9 constituting quantum multiwells is then produced on the Bragg mirror 7. For example, there are 3 to 10 quantum multiwells (width of the wells = 10 nm), (width of the barriers = 10 nm) located in a GaAlAs material. Each ternary composition layer 8 and 11 located on both sides of quantum multiwells 9 is n+ and p+ doped, respectively. Then, a p+ doped Bragg mirror 12 is produced.

The number of alternations of the layers of Bragg mirror 12 is lower than that constituting Bragg mirror 7 to optimize the escape on output mirror 12 (optimization of the excess voltage coefficient of the cavity).

Figure 2:
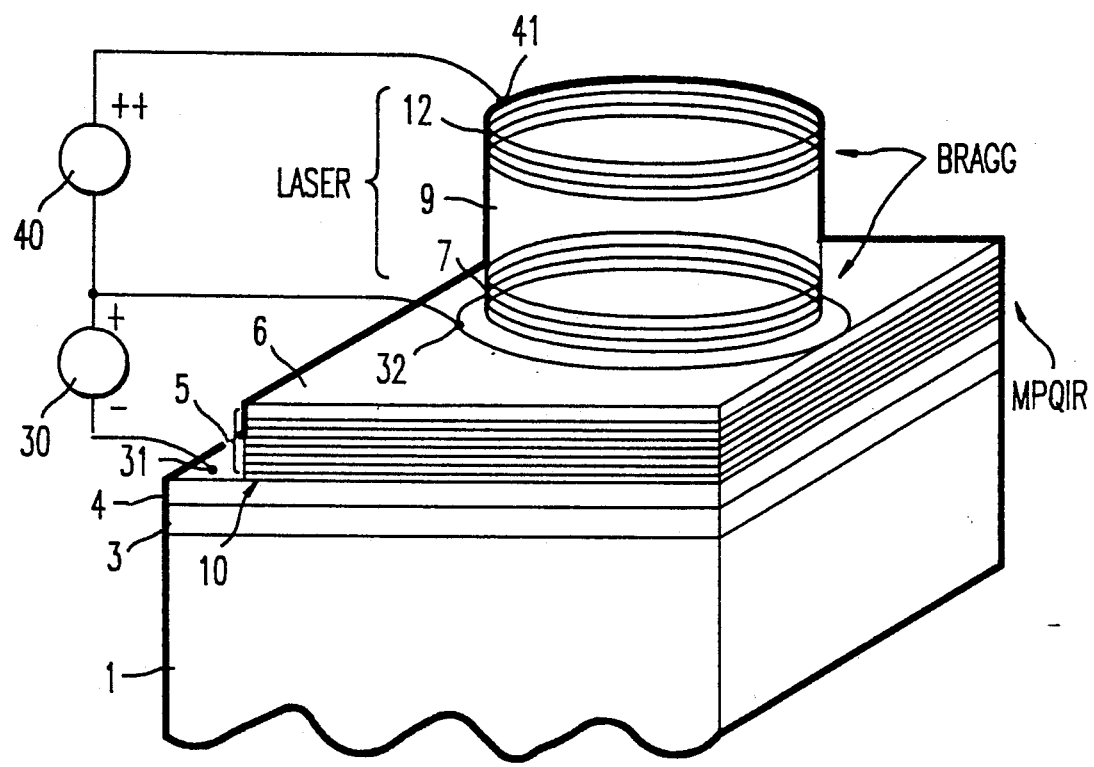
FIG. 2 gives a more detailed embodiment of light frequency converter of the present invention.

FIG. 2 represents a detailed embodiment of the present invention according to which Bragg mirrors 7 and 12 and laser emission part 9 have been engraved to constitute a contact on quantum multiwell detector 5.

The process of production of the device will consist in producing on substrate 1 the sequence of various layers described in relation to FIG. 1. Then, the two-dimensional space distribution of the detectors is achieved by selective etching of all the layers. A group of MESA structures is thus obtained. Layer 4 of AlAs (n+) close to the substrate represents a buffer or stop layer relative to this etching. A second etching operation makes it possible to define the pattern of the laser diode (lateral confinement). The production of these pixels (delimitation of zones) can also be considered by using an ion beam etching. Then, by using techniques for masking and insulation by deposition of silica or alumina, ohmic contacts with definition of the electrode pattern are produced.

For the operation of such a device, a first voltage generator 30 is connected to ohmic contacts 31 and 32 located respectively on layer 4 and on layer 6. Further, a second voltage generator 40 is connected to chemical contact 32 and to ohmic contact 41 located on Bragg mirror 12.

Figure 3:
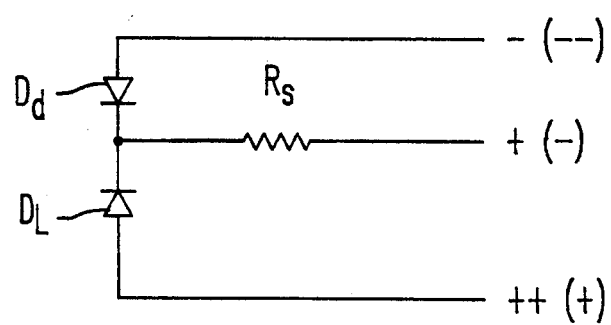
FIG. 3 details an example of an electric circuit corresponding to the light frequency converter of the present invention.

The electrical diagram of the device is as represented in FIG. 3, in which detector ($D_d$) and emission laser ($D_L$) are connected in series and in opposition.

The control of photodetector part $D_d$ is therefore achieved by applying a voltage to the nin zone of the structure. N+ doped layer 4 located in the vicinity of the substrate represents common electric part (−). Second n+ doped layer 6 deposited after structure 5 makes it possible to apply a voltage to the detection structure.

The detection part acts as a variable resistance but also as a current generator. This resistance and the photocurrent generated depend on the incident optical intensity. This photodetector can become weaker than resistance Rs connected in series with the laser diode.

The control of the emissive part requires that laser diode part $D_L$ be prepolarized by applying a voltage and by applying a current through junction pn of the active part. In the absence of detected radiation, diode $D_d$ does not conduct, i.e., does not generate a current.

By acting on the values of resistance connected in series, and according to the structure of diodes being considered (head to foot or series), it is possible to achieve functions of threshold triggering or bistability in the laser emission as a function of the illumination.

This linking of two functions by growth of semiconducting materials makes it possible to produce a multifunction component in plate form where one of the faces is subjected to the illumination to be detected and the other emits a radiation in the specific spectral region in the active material employed in junction pn of the laser diode.

The type of integration described above is not specific to the use of quantum multiwell detectors. The same type of integration of the two functions can be considered by using, for example, a heteroepitaxy of II-VI or else III-V materials.

For example, the deposition of HgCdTe achieved from the method of molecular jet epitaxy on GaAs makes it possible also to integrate the detection function on one of the faces of the substrate and the emission function on the other face.

A monolithic device making it possible to transpose one radiation located in a spectral region (invisible radiation, for example) to another has been described. The selection of materials deposited on the resonant quantum multiwell structure for a wavelength will make it possible to generate an optical wave in a desired spectral region.

One face of the device receives the radiation to be detected, the other face emits a laser wave located in the near IR or in the visible spectrum. Thus, it is possible to design brilliance amplifier type systems able to be inserted in imager assemblies. In this case, the use of III-V materials (in detection and in emission) has an advantage of being able to produce quick imagers (absence of remanence).

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A light frequency converter comprising:
   a quantum multiwell or supernetwork photodetector formed of a group of layers and comprising a first and a second face, wherein light radiation to be converted is received on the first face and detected by the photodetector;
   a laser device placed on the second face of the photodetector having a plurality of semiconductor layers formed in a direction parallel to said group of layers of said photodetector and electrically connected in series with the photodetector.

2. A light frequency converter according to claim 1, wherein the first face comprises a network for coupling the device with radiation to be detected.

3. A light frequency converter according to claim 1, wherein the photodetector is integral by its first face with a substrate receiving radiation to be detected and transmitting it to the photodetector.

4. A light frequency converter according to claim 3, wherein the substrate receiving the radiation to be detected has a network for coupling the substrate with the radiation to be detected.

5. A light frequency converter according to claim 1, further comprising:
   a first ohmic contact layer connected to the first face;
   a second ohmic contact layer connected to the second face and to the laser device; and
   a third ohmic contact layer connected to a fourth face opposite to a third face of the photodetector.

6. A light frequency converter according to claim 5, further comprising:
   a first voltage source connected between the first and the second ohmic contact layer; and
   a second voltage source connected between the second and the third ohmic contact layer.

7. A light frequency converts according to claim 1, wherein the photodetector consists of quantum multiwells and the laser device also consists of quantum multiwells.

8. A light frequency converter according to claim 7, wherein the photodetector consists of alternations of GaAs and $Ga_{1-x}AlAs$ layers.

9. A light frequency converter according to claim 7, wherein the laser device consists of alternations of AlAs and $Ga_{1-x}Al_xAs$ layers.

* * * * *